(12) United States Patent
Murari et al.

(10) Patent No.: US 6,720,080 B2
(45) Date of Patent: Apr. 13, 2004

(54) FINISH FOR GLASS FABRICS USED FOR REINFORCING EPOXY STRUCTURES

(75) Inventors: Shobha Murari, Greenville, SC (US); Richard G. Adams, Lavellette, NJ (US); H. Landis Carter, Greer, SC (US)

(73) Assignee: JPS Glass and Industrial Fabrics, Slater, SC (US)

( * ) Notice: Subject to any disclaimer, the term of this patent is extended or adjusted under 35 U.S.C. 154(b) by 57 days.

(21) Appl. No.: 09/873,401

(22) Filed: Jun. 4, 2001

(65) Prior Publication Data

US 2002/0051888 A1 May 2, 2002

Related U.S. Application Data

(60) Provisional application No. 60/231,054, filed on Sep. 8, 2000.

(51) Int. Cl.⁷ .......................... B32B 17/02; B32B 27/04; D06M 11/77; D06M 11/78
(52) U.S. Cl. ................. 428/429; 428/413; 428/447; 428/300.1; 428/312.6; 442/180; 252/8.81
(58) Field of Search ............................. 528/38, 39, 42, 528/32, 10, 12, 25, 26; 428/446, 447, 448, 413, 426, 428, 429, 311.11, 312.6, 300.1; 442/180; 252/8.81

(56) References Cited

U.S. PATENT DOCUMENTS

| | | | | | |
|---|---|---|---|---|---|
| 5,885,436 | A | * | 3/1999 | Ameen et al. | 205/125 |
| 5,908,542 | A | * | 6/1999 | Lee et al. | 205/102 |
| 6,051,314 | A | * | 4/2000 | Girgis | 428/361 |
| 6,117,536 | A | * | 9/2000 | Poutasse | 428/301.1 |

* cited by examiner

*Primary Examiner*—Robert Dawson
*Assistant Examiner*—Michael J Feely
(74) *Attorney, Agent, or Firm*—McNair Law Firm, P.A.

(57) ABSTRACT

A composition and method for selectively increasing the resin flow and gel time of an epoxy resin that fills the capillary region between filaments in fiberglass yarns making up a woven fabric. The composition and method are used in the lamination of fiberglass reinforced composites such as copper clad laminates for circuit boards and reduces the occurrence of voids in the capillary region.

9 Claims, 3 Drawing Sheets

(3 of 3 Drawing Sheet(s) Filed in Color)

FINISH FOR GLASS FABRICS USED FOR REINFORCING EPOXY STRUCTURES

CROSS REFERENCE TO RELATED APPLICATION

This application is based on and claims priority from provisional application Ser. No. 60/231,054 filed Sep. 8, 2000.

FIELD OF THE INVENTION

This invention relates to finishes for glass fabrics that are used to reinforce structures formed from epoxies and like materials. In particular, the invention relates to finishes employing silane based coupling agents for woven glass fibers. More specifically, the invention relates to glass fiber fabric reinforced circuit board laminates.

BACKGROUND OF THE INVENTION

The need for coupling agents was first recognized in 1940 when glass fibers began to be used as reinforcement in organic resin composite structures. Specific strength to weight ratios of early glass fiber resin composites were higher than those of aluminum or steel, but they lost much of their strength during prolonged exposure to moisture. The interface between such dissimilar materials as an organic polymer and an inorganic glass fiber did not allow the formation of a water resistant bond. A variety of materials have since been developed in an attempt to provide a stable interface under a varying number of adverse environments. These coupling agents can generally be described as molecules which possess two different kinds of reactivity. The siloxane portion of these molecules has reactivity with the glass, while the organic portion of the molecule is tailored to react with organic thermosetting resins used in composite manufacturing. The main function of the coupling agent is to provide a stable bond between two dissimilar surfaces.

The majority of such coupling agents have the general formula:

Where R is a reactive organic group tailored to match the reactivity of the resin system with which it will be used.

The siloxane portion will react with the glass surface as:

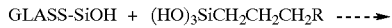

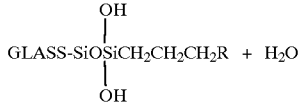

More than one SiOH group may react with the glass surface, or alternatively with other silane molecules to form siloxane oligomers or polymers, which can still provide a link between glass and resin.

Epoxy resins have commonly been used in the manufacture of multilayered laminates for various applications in the electronic, recreation, marine, and aerospace industries. The most common epoxy is formed from epichlorohydrin and bisphenol A. The resin is usually provided in the form of a low molecular weight oligomer, which can be cross-linked with a bi-functional curing agent to result in a solid thermoset polymer. Catalysts are often added to accelerate the reaction with the curing agent. Multi functional epoxies are sometimes added to the resin mix to improve the high temperature resistance of the cured resin. Straight chain polymerization of epoxy can result in a solid material, which is thermoplastic and can be melted. Cross-linking with the curing agent provides a thermoset solid, which does not melt.

To make multilayered laminates, prepregs are first made by pulling glass cloth through a solution of the particular resin system chosen. The glass cloth is impregnated with the resin mix and then proceeds to a heated tower where the solvent is driven off and the resin is partially polymerized to a "B" stage. It is important that little, or no cross-links occur, before the resin can melt and flow in the laminating process. The prepreg process is tightly controlled to provide an optimum melt viscosity for lamination.

Prepregs are tested for melt viscosity, resin gel time and resin content. The gel time measurement is widely used in determining the potential reactivity of the prepreg material, as well as, the time available for resin flow in press lamination. Controlling these parameters has been thought to be critical if a void free cured laminate is to be obtained. Gel time is also an indicator of the rate of increase of melt viscosity in press lamination.

A common problem for multilayered laminates, such as circuit board is delamination during wave soldering. The most common cause of delamination during soldering is moisture absorption. The thermal energy imparted to the board in contact with 550° F. solder vaporizes any absorbed moisture and the resulting steam pressure forces the laminations apart at the line of the weakest bond. Moisture, which accumulates in even minute voids, is especially likely to produce blistering during the soldering process.

Accordingly, it is one objective of the present invention is to eliminate voids and the resulting entrapped moisture in laminated fiberglass/epoxy composites, so that rupture of the structures will not occur due to the thermal shock of the soldering process.

In the preparation of woven glass fabrics for use in a composite epoxy structure for circuit boards, organofunctional alkoxysilane finishes are applied to heat cleaned fiberglass fabrics from dilute aqueous solutions. The finish content of the dried fabric is typically 0.075% to 0.30% of the fabric weight.

Epoxy resins are usually formulated with difunctional or multi functional curing agents, which provide cross-linking thereby resulting in a thermoset polymer after curing. A catalyst to accelerate the curing is often added to the epoxy formulation. In some cases epoxy resin, curing agent, and catalyst are applied to a glass fiber substrate in solution, and dried at an elevated temperature to remove the solvent. In some applications, it is advantageous to continue heating impregnated substrates to increase the resin molecular weight, and thus its melt viscosity. This is known as a "B" stage prepreg. Any significant cross-linking in the B stage prepreg will prevent the resin from melting and flowing in a heated press during consolidation and curing of laminates. The typical epoxy resin formulation for making circuit board prepreg comprises epoxy resin dissolved in an organic solvent, dicyandiamide (dicy) curing agent, and an imidazole accelerating catalyst.

Electrical grade laminates for circuit boards are made by curing layers of epoxy/fiberglass prepreg between copper foil surface sheets. In the laminating process, multiple sheets of epoxy/fiberglass prepreg are placed between copper foil surface sheets. These lay ups are placed between metal laminating plates. A number of these assemblies are stacked to form a book, and each book is placed between heating platens in a multi-opening press. Two competing processes occur as the prepreg is heated in the press. First, the epoxy resin melts, and its viscosity is reduced with increasing temperature. As the temperature rises, the resin begins to polymerize and increase in viscosity. Finally the resin is sufficiently cross-linked that it gels and can no longer flow. Consolidation of the laminate must be completed before the resin gels. Complete cure is achieved with additional time in the press and increased temperature. The two processes must be carefully balanced to insure a void free laminate with good thickness control, and minimize resin loss at the laminate edges. If the resin gels too soon, there may not be sufficient flow to remove solvent or air trapped in the capillaries between individual filaments in a fiber bundle. Minute voids in the capillary spaces of the cured laminate are often referred to as silver streaks.

In circuit board manufacturing, the copper clad boards are coated with a photosensitive acid resist. The desired circuitry is then photo printed on the copper. The board is then subjected to a hot acid bath to remove the unwanted copper. Holes are drilled for mounting surface components, or for establishing electrically conductive connections between circuits on both sides of the board.

The holes are then electroplated. Finally, the board with its assembled components is floated across a 550° F. molten solder bath. Any moisture, which has been absorbed into a void or silver streak during the wet processing of the board, will cause it to blister. If a void stretches between two adjacent through holes, it may cause a short circuit in the finished assembly.

As with most manufacturing processes, it is desirable to maximize the productivity of capital equipment. For some applications, a high laminate glass transition temperature is required. These objectives can be achieved by increasing the catalyst, the curing agent, or the processing temperatures, individually or in combination. These speeded up processes are difficult to control, and have a very narrow processing window for quality production. Any premature gelling of the resin in the prepreg "B" stage or in lamination will result in scrap laminates. Capillary voids cannot be seen until the copper foil is etched. Even then, they are often hard to see. If silver streaks are undetected in the laminates in early stages of circuit fabrication, the cost of scrap escalates. As a quality check, acid is used to remove all of the copper foil from one or more laminates of a production lot to check for silver streaks. This does not preclude that some laminates in the lot may have silver streaks. Understandably, circuit board laminators, and their customers, are anxious to have the assurance of materials and processes, which eliminate all silver streaks.

One method of increasing the size of the processing window, is to add a weak acid, such as boric acid, succinic acid, citric acid, benzoic acid or maleic acid, to the epoxy resin mix to complex with the catalyst, and make it latent until a desired curing temperature in the range of 190–210° C. is reached in the press, at which time the cure is very rapid and complete. Such a process is described in U.S. Pat. No. 5,308,895 and U.S. Pat. No. 5,314,702. The objective of this process, is to have all of the resin in the prepreg gel at the same time and temperature and cure very rapidly.

Silver streaks have been an occasional quality problem in electrical laminates in the past, but the move to faster curing resin systems has greatly increased the severity and cost of the problem. While the latent catalyst approach of the before mentioned patents sufficiently controls the gel time of free resin on the surface of the prepreg layers and between yarns, there may be insufficient gel time or too rapid an increase in melt viscosity for the inherently slower capillary flow within the yarn bundles to eliminate capillary voids or silver streaks. Lengthening the overall gel time of the resin to accommodate greater capillary flow will result in excessive edge loss and lack of thickness control. Since the glass fiber fabric is typically only 30% to somewhat less than 50% of the volume of typical electrical prepreg, ensuring sufficient flow in the yarn capillaries to eliminate voids without excessive outflow of the free resin presents a serious problem.

Furthermore, some of the best finishes for obtaining superior laminate properties contain silanes with amine functional groups. These amino-functional silanes have primary or secondary amine groups, which can react with, or catalyze, epoxy resins at a lower than desired press temperatures. Amine functional silanes are advantageous for finishing fiberglass fabrics. Because of their cationic nature, they are attracted to the anionic glass fiber surface, and provide a more evenly distributed finish.

Accordingly, a broad objective of the present invention is to eliminate the silver streak problem.

One specific objective of the present invention is to selectively control the gel time of resin in the capillaries between the filaments of the yarn bundles making up the fiberglass fabric.

A second objective of the invention is to provide a coupling agent finish for fiberglass fabrics to independently control the gel time of resin in the capillaries and melt viscosity.

Still another objective of the invention is to provide a simple test method to predict, in the laboratory, the degree capillary gel time control provided by any given fabric finish.

These and other objectives of the invention are achieved by the present invention, which will be better understood by the summary of the invention and detailed description, which follows below:

SUMMARY OF THE INVENTION

It has surprisingly been found that the foregoing objective can be achieved by incorporating a catalyst inhibitor in the finish applied to glass fibers and glass fabric, so that the gel time of a polymeric resin is selectively lengthened as the resin flows around individual glass filaments and the capillary spaces between them. The longer time to gel within the yarn bundles allows the resin to flow completely around filaments eliminating capillary voids or silver streaks, while the free resin retains its faster gel time preventing excessive edge resin flow and maintaining thickness control. This benefit is surprisingly achieved without any increase in cure time in the press.

Accordingly, in one primary aspect the invention is a composition and method for selectively controlling the gel time of an epoxy resin in the capillary regions of a glass fabric. Another aspect of this invention is a novel finish comprising an epoxy reactive organosilane coupling agent and catalyst inhibitor capable of selectively lengthening the flow time within the capillaries of a glass fabric. Still another aspect of this invention is a laboratory test to determine the relative degree of lengthening of said gel time.

A further aspect of the invention, is a method of selectively lengthening the gel time of an epoxy resin within the yarn bundles of a fiberglass fabric comprising the steps of providing cleaned woven glass fabric, providing a silane finish bath for the fabric, adding boric acid or other weak acid to the bath, immersing the fabric in the bath, drying the fabric, and subsequently impregnating the fabric with an epoxy resin mix whereby the gel time within the yarns is selectively lengthened.

In another aspect the finish of the invention includes at least one cationic amino-functional alkoxysilane coupling agent and a weak acid that can complex with the amino function to provide a latent reactivity with epoxy resin, whereby during lamination under heat and pressure the finish selectively provides a longer resin flow time and a slower increase in resin viscosity. The finish may include an additional alkoxysilane coupling agent having a critical surface tension greater than that of the epoxy resin to promote resin wetting of the finished fabric. The weak acid in the finish may be predetermined to complex with the catalysts in selected resin formulations.

The invention also includes the method of making glass fiber reinforced articles of polymeric materials including circuit boards and the like products where it is important that the polymeric material substantially fills the voids between fiber filaments.

DESCRIPTION OF THE DRAWINGS

In the drawings which are appended hereto and made a part of this disclosure.

The file of this patent contains at least one drawing executed in color. Copies of this patent with color drawing(s) will be provided by the Patent and Trademark Office upon request and payment of the necessary fee.

DETAILED DESCRIPTION

Figure 1:
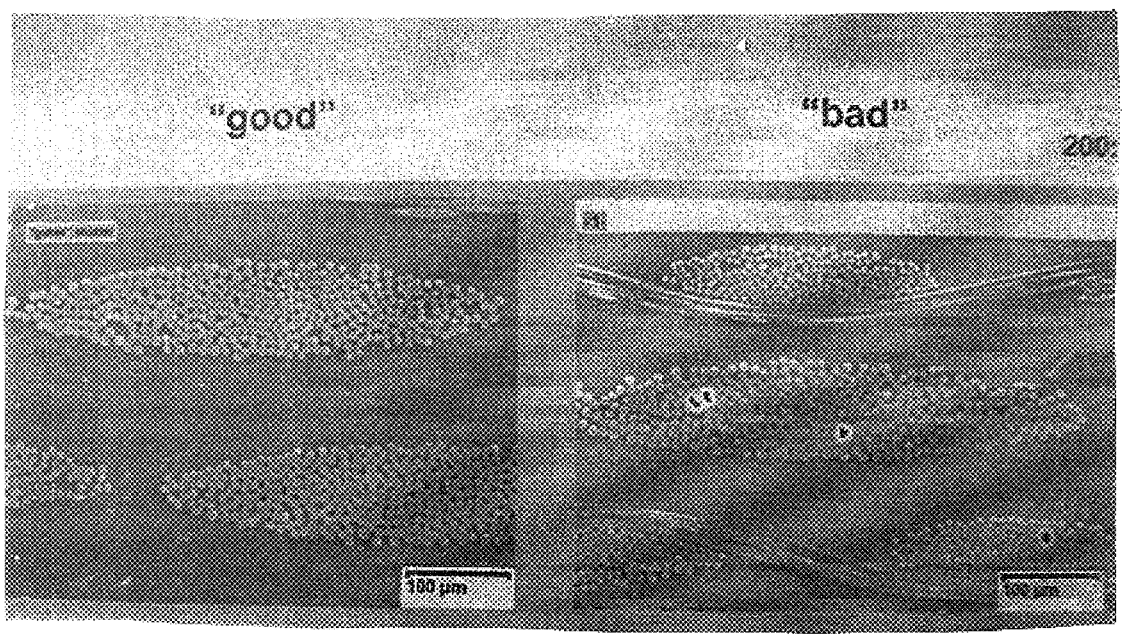
FIG. 1 is a scanning electron photomicrograph of two cross sections of fiberglass fabric reinforced epoxy composites namely, a circuit board laminate, magnified 200:1, showing a "good" cross section having no voids within the yarns and a "bad" cross section showing several capillary voids within two yarns as represented by the dark spots. The white halos around the voids are an artifact of electron micrography.

In an effort to solve and find the reason for capillary voids in epoxy/fiberglass circuit board laminates, many organo-functional silanes and combinations thereof have been evaluated as finishes, but none have proved satisfactory with today's faster curing resin systems. Trials, which involve finishing large quantities of fiberglass fabric followed by making prepreg and pressing laminates in a manufacturing facility, are very costly, and often yield little insight into the cause of the voids. Thus a model system to learn more about the cause was developed. Glass micro beads were used as a model for the fiberglass surface. The micro beads were treated with various silane finishes, and dried as in normal production. A formulated epoxy resin mix was mixed with the micro beads and heated to remove the solvent. The mixture was then placed on a plate heated to 350° F., and the time for the resin to gel was recorded. Untreated micro beads were used as a control. Micro beads treated with some silane finishes were found to yield a shorter gel time than the control, indicating a catalytic effect on the resin. Surprisingly this was the case even when the resin was formulated with boric acid to give latency to the imidazole catalyst.

It has been assumed, that the reaction between resin and silane finished glass fibers is limited to a layer only a few molecules thick at the immediate surface. It has also been assumed, that silver streaks were due to poor wetting of the fiberglass yarns. It now appears, that some silanes may have a catalytic effect on epoxies extending considerably further into the impregnated resin than previously thought. This catalytic effect is sufficient to cause premature resin gel, and trap voids in yarn capillaries, while free resin in the interlaminar surfaces and between yarns flows much faster and gels later. In manufacturing practice, the resin gel time is controlled to minimize resin flow at the laminate edges and to maintain a specified thickness.

It has been discovered, that the addition of certain weak acids to an amine functional silane finishing bath will provide a finished glass fiber fabric, which overcomes the problem of capillary voids or silver streaks. To solve this problem a slower rate of melt viscosity increase, as indicated by a longer gel time, is required for the resin within the yarns because of slower capillary flow. For this reason the addition of a weak acid to an amine functional silane coupling agent finish is desirable to lengthen the gel time of catalyzed epoxy resin, which infiltrates the glass fibers. It is also desirable in the case where the finish contains an amine functional silane, which is catalytic to epoxies. Thus, the invention is not limited to finishes for use with epoxy resin formulations containing latent catalysts. The acid should be chosen from those that do not volatilize during drying of the finish or in prepreg and laminate processing. Such acids should complex with the amine function of the finish, but dissociate at a temperature at, or below, the final curing temperature in the press, so as not to hinder a rapid laminate cure.

We have discovered, that finishes comprising at least one cationic aminosilane, chloroalkylsilane, and boric acid give the best results. Chloropropylsilane finished fiberglass has been shown to have critical surface tension greater than that of typical epoxy resins, and is thus easily wet by epoxy resin. The preparation of a finish illustrating the invention begins with the preparation of a bath for the glass fiber, as in the following example: Three commercially available silanes are mixed together namely:

TABLE 1

| Reactive group | Manufacturer | Manufacturer's Code |
| --- | --- | --- |
| Amino + Vinyl | Dow Corning | Z 6032[1] |
| Amino | Dow Corning | Z 6020[2] |
| Chloro | OSI | Z 6026[3] |

[1]N-2-(Vinylbenzylamino)-ethyl-3aminopropyl trimethoxysilane monohydrogen chloride
[2]N-2-aminoethyl)-3 aminopropyltrimethonysilane
[3]3-chloropropyltrimethoxy silane The foregoing silanes are mixed together based on their organosilane content. The bath volume is 100 gallons of water to which acetic acid is added to maintain a pH level in the 3 to 5 range. About 0.1 to 5% of the silane mixture are added followed by the addition of 0.05% by weight of cationic surfactant, then boric acid is added in the range of 0.1 to 5.0% of the weight of the silanes, as required to adjust the capillary gel time for a given resin formulation. Fiberglass fabric, which has been heat cleaned to remove yarn and weaving sizes, is dipped in the finish bath, squeezed between rollers to remove the excess then dried in an oven. The dried finish concentration is typically between 0.075 and 0.30% by weight of the dried fabric, but may vary depending on the catalyst used in the epoxy resin. In an alternate finishing method, the boric acid can be applied as an after treatment on the silane finished fabric. The now finished fabric is ready for use as the reinforcing material in a fiberglass/epoxy composite laminate for circuit boards or other applications. This finish exhibits superior wetting by the epoxy resin during impregnation, and the boric acid will allow additional time for the resin to flow within the interstitial space between filaments that form capillaries of the yarns before the resin gels. In addition, the longer gel time allows a slower build up of resin melt viscosity, further enhancing capillary resin flow.

Figure 2:
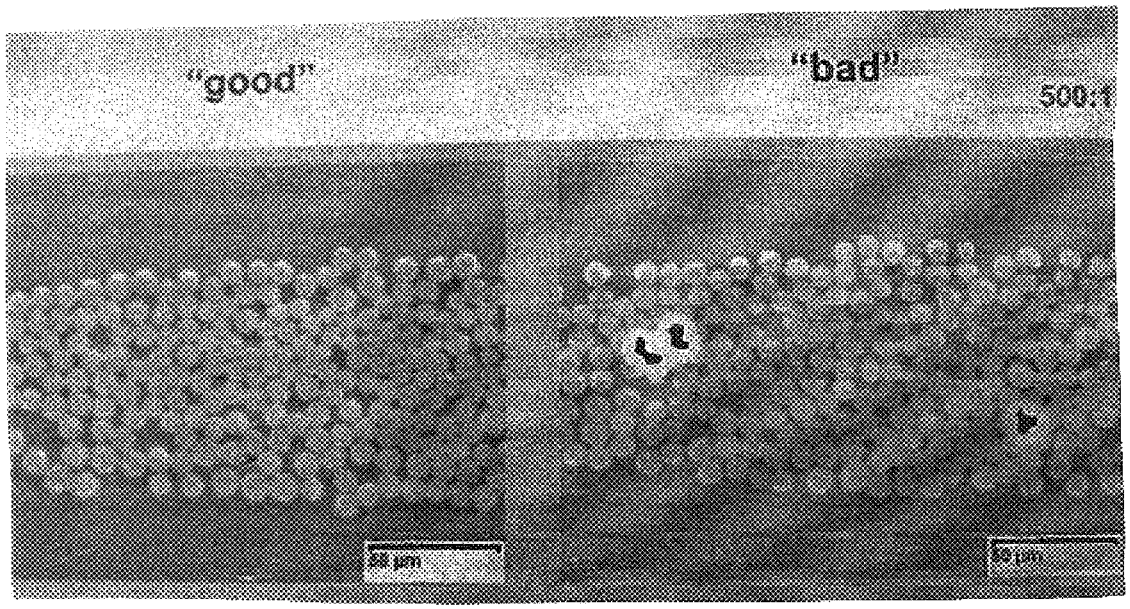
FIG. 2 is an electron micrograph showing the voids at 500:1 magnification.
Figure 3:
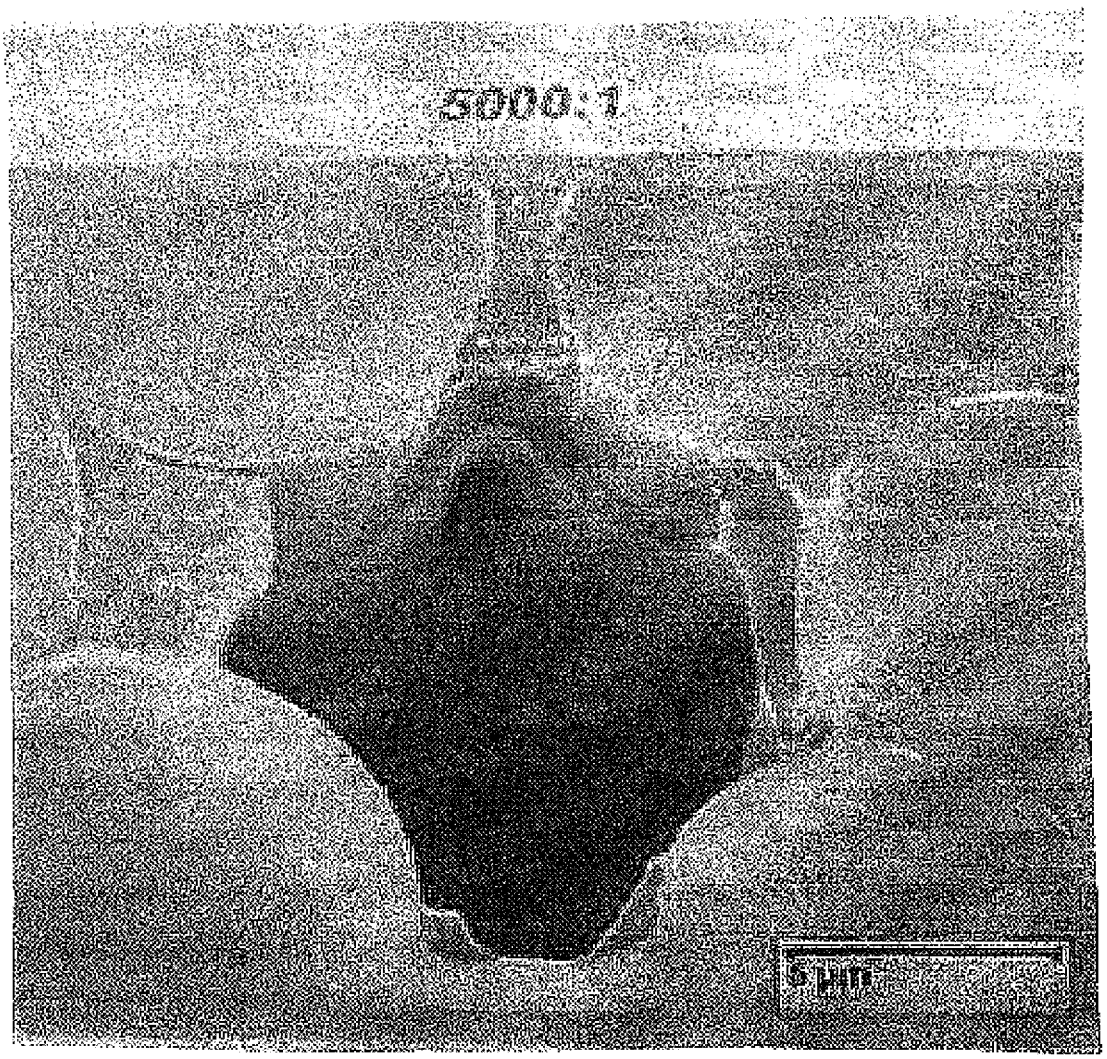
FIG. 3 is an electron micrograph of a void at 5000:1 magnification where some resin has been chipped away from the fibers in sample preparation. This shows that resin has coated the fibers, but there was insufficient resin flow to fill the capillary void.

Referring now to FIG. 1, typical circuit board laminates in magnified images are presented side by side cross sections labeled good and bad. The bundles of filaments are shown surrounded by epoxy. These bundles are the yarn from which the glass fabric is woven. In the side labeled "bad", the dark spots surrounded by light halos are capillary voids. FIG. 2 is a greater magnification of part of FIG. 1. FIG. 3 is an electron micrograph of a void at 5000:1 magnification, where some resin has been chipped away from the fibers in sample preparation. This shows that resin has coated the fibers, but there was insufficient resin flow to fill the void.

Returning now to the glass bead test described above, the effect of variations of the finish according to the present invention is demonstrated below. Epoxy resin formulated with dicyandiamide curing agent, an imidazole catalyst, and boric acid catalyst inhibitor was used. This formula duplicates one used in industry. This test is to predict which finishes will be best able to eliminate the capillary voids without actually having to carry the process through all the manufacturing steps to a finished laminate.

The time the epoxy resin takes to gel at 350° F., when mixed with untreated beads was assigned a value of 1.0 in a "gel time index", and is the control. In comparing finished beads, the numerator is the time to gel with the specified finish and the divisor is the time to gel with the unfinished control and the quotient is the gel time index. An index number more or less than one, indicates that the finish is causing acceleration of resin gelling and will probably cause capillary voids or silver streaks in actual laminates. An index number greater than one, indicates that the finish is lengthening the gel time and is less likely to cause capillary voids in an actual laminate.

The following results were obtained:

| Finish Description | Gel Time Index |
| --- | --- |
| None | 1.0 |
| Three silanes (Table 1) | 1.35 |
| Three silanes + 1% boric acid | 1.54 |
| Three silanes + 2% boric acid | 1.62 |
| One half the amount of the three Silanes + 2% boric acid | 1.79 |

While the example above utilizes an epoxy resin system containing an imidazole catalyst, boric acid and dicyandiamide as curing agent, the finishes of this invention have wide spread additional applications. We have determined that cationic amino-silane finishes on fiberglass fabrics have a catalytic effect on the cure of epoxy resin systems and, that this effect is additive to the effect of a catalyst in the resin system. We have also determined, that it is advantageous to selectively extend the gel time of epoxy resin in the capillaries between fiberglass filaments in a multi-filament yarn to insure sufficient flow to eliminate voids. Therefore the invention has the following applications:

In epoxy resin systems containing only epoxy resin and curing agent, to latently block the catalytic effect of the amino-silane in the finish to provide sufficient capillary resin flow to achieve a void free laminate in epoxy resin systems containing a catalyst in addition to a curing agent, to block the catalytic effect of the amino-silane and to latently inhibit the resin catalyst and lengthen the time of capillary flow. Other epoxy curing agents and catalysts are within the scope of this invention. For example; anhydride curing agents with tertiary amine catalyst.

These resin systems are used in molding structural parts for many applications in addition to electrical laminates. End use applications include aerospace, boats, machine components, and general structural applications. Molding methods include press, autoclave and, resin injection molding.

It is understood that variations and additional embodiments within the scope of our invention may occur to those skilled in the art after reading our above specification but our invention is limited only by the claims which follow:

What is claimed is:

1. A finish for glass fiber fabrics formed of multi-filament yarns that are used with epoxy resins in the manufacture of reinforced epoxy resin laminates and like articles, said finish comprising:

a) at least two coupling agents comprising: a cationic amino-functional alkoxysilane coupling agent and a chloropropyl-silane coupling agent for increasing the wetability of fiber surfaces to which the finish is applied;

b) a weak acid for complexing the amine function of said agent, said weak acid being selected from the group consisting of: boric acid, maleic acid, succinic acid, and other weak acid;

whereby prior to gelling of said epoxy resin, during the manufacture of said laminate, the epoxy resin which flows in the capillaries formed by the fiber filaments and which is in contact with the fibers to which said finish has been applied, will have a longer resin flow time and slower increase of resin viscosity within the capillaries of said multi-filament yarns before the epoxy resin gels when compared to the flow time and viscosity increase of epoxy resin between the yarns in the fabric and on the fabric surfaces between plies of said fabric in reinforced articles; whereby the epoxy resin has time to fill voids in the capillary region before gelling thus significantly reducing the incidence of voids.

2. The finish of claim 1 wherein subparagraph a) at least three coupling agents are included said agents comprising:

i) N-(2aminoethyl)-3-aminopropyltrimethoxysilane, ii) N-2-(Vinylbenzylamino)-ethyl-3aminopropyltrimethoxysilane monohydrogen chloride, and iii) 3-chloropropyl-trimethoxysilane.

3. The finish of claim 1 wherein said finish has an excess of weak acid, said excess being a predetermined quantity sufficient to complex with the catalyst in the selected epoxy resin formulation thereby extending the melt flow, rate of viscosity increase, and gel time of the epoxy in contact with the finish within the yarn capillaries.

4. The finish of claim 1 wherein the weak acid is boric acid.

5. A glass fiber fabric having the finish of claim 1.

6. A finish bath for glass fabrics that are used for reinforcing articles formed from epoxy resin, wherein said glass fabrics are made from multifilament yarns; said finish bath comprising:

a) water;
b) a cationic amino-silane coupling agent;
c) a chloropropyl-silane coupling agent for increasing wetability of said finish bath; and
d) a weak acid selected from the group consisting of boric acid, succinic acid, and maleic acid, wherein said finish bath provides an increase in resin flow time within the filaments of said fabric when said fabric is immersed in said bath, removed from said bath, and dried.

7. The finish bath of claim 6 wherein boric acid is the weak acid.

8. The finish bath of claim 7 wherein boric acid is present in the range of about 0.1% to 5% by weight of the silane coupling agents.

9. A glass fiber fabric that has been finished in the bath of claim 6.

* * * * *